United States Patent
Uh et al.

(10) Patent No.: US 7,632,622 B2
(45) Date of Patent: Dec. 15, 2009

(54) ANTIREFLECTIVE HARDMASK COMPOSITION AND METHODS FOR USING SAME

(75) Inventors: Dong Sun Uh, Seoul (KR); Ji Young Jung, Seoul (KR); Jae Min Oh, Kyoungki-do (KR); Chang Il Oh, Kyoungki-do (KR); Do Hyeon Kim, Kyoungki-do (KR)

(73) Assignee: Cheil Industries, Inc. (KR)

( * ) Notice: Subject to any disclaimer, the term of this patent is extended or adjusted under 35 U.S.C. 154(b) by 336 days.

(21) Appl. No.: 11/301,049

(22) Filed: Dec. 12, 2005

(65) Prior Publication Data
US 2007/0003863 A1 Jan. 4, 2007

(30) Foreign Application Priority Data
Jun. 17, 2005 (KR) ...................... 10-2005-0052169

(51) Int. Cl.
G03C 1/73 (2006.01)
G03C 1/76 (2006.01)
G03F 7/11 (2006.01)

(52) U.S. Cl. .............. 430/270.1; 430/271.1; 430/276.1; 430/313; 430/914

(58) Field of Classification Search .............. 430/270.1, 430/271.1, 276.1, 512, 313, 914
See application file for complete search history.

(56) References Cited

U.S. PATENT DOCUMENTS

| | | | |
|---|---|---|---|
| 4,525,523 A * | 6/1985 | Nakamura et al. ........... | 524/572 |
| 5,420,233 A | 5/1995 | Isogai et al. | |
| 5,518,864 A * | 5/1996 | Oba et al. ................... | 430/325 |
| 5,851,730 A * | 12/1998 | Thackeray et al. ........ | 430/271.1 |
| 5,886,102 A | 3/1999 | Sinta et al. | |
| 5,939,236 A | 8/1999 | Pavelcheck et al. | |
| 6,607,988 B2 * | 8/2003 | Yunogami et al. ........... | 438/720 |
| 2002/0132095 A1* | 9/2002 | Fujii et al. .................. | 428/209 |
| 2002/0182536 A1* | 12/2002 | Kamada et al. .......... | 430/270.1 |
| 2003/0129531 A1* | 7/2003 | Oberlander et al. ...... | 430/271.1 |
| 2003/0129547 A1* | 7/2003 | Neisser et al. .............. | 430/322 |
| 2005/0255410 A1* | 11/2005 | Guerrero et al. ............ | 430/311 |
| 2006/0019195 A1* | 1/2006 | Hatakeyama et al. .... | 430/270.1 |
| 2006/0251990 A1 | 11/2006 | Uh et al. | |
| 2006/0269867 A1 | 11/2006 | Uh et al. | |
| 2007/0059635 A1 | 3/2007 | Oh et al. | |
| 2007/0072111 A1 | 3/2007 | Oh et al. | |
| 2007/0154658 A1 | 7/2007 | Kang et al. | |

FOREIGN PATENT DOCUMENTS

| | | |
|---|---|---|
| CA | 1204547 | 5/2006 |
| JP | 1-293339 | 11/1989 |
| JP | 06-136122 | 5/1994 |
| JP | 9-146100 | 6/1997 |
| JP | 11-084391 | 3/1999 |

* cited by examiner

*Primary Examiner*—Cynthia H Kelly
*Assistant Examiner*—Anca Eoff
(74) *Attorney, Agent, or Firm*—Meyers Bigel Sibley & Sajovec, PA

(57) ABSTRACT

Hardmask compositions having antireflective properties useful in lithographic processes, methods of using the same, and semiconductor devices fabricated by such methods, are provided. Antireflective hardmask compositions of the invention include:
(a) a polymer mixture including
a first polymer that includes one or more of the following monomeric units

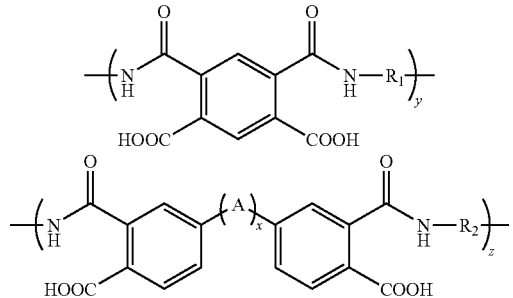

wherein A is a bivalent radical selected from the group consisting of carbonyl, oxy, alkylene, fluoroalkylene, phenyldioxy, and any combination thereof; $R_1$ and $R_2$ are each independently a bivalent radical selected from the group consisting of an alkylene, an arylene, and any combination thereof; and x, y, and z are 0 or integers; and
a second polymer including an aryl group;
(b) a crosslinking component; and
(c) an acid catalyst.

15 Claims, No Drawings

ANTIREFLECTIVE HARDMASK COMPOSITION AND METHODS FOR USING SAME

CROSS-REFERENCE TO RELATED APPLICATION

This application claims priority under 35 U.S.C. § 119 from Korean Patent Application No. 10-2005-0052169, filed on Jun. 17, 2005, in the Korean Intellectual Property Office, the disclosure of which is incorporated by reference herein as if set forth in its entirety.

FIELD OF THE INVENTION

The present invention relates to hardmask compositions having antireflective properties useful in lithographic processes, and more particularly to hardmask compositions including polymers having strong absorbance in the short wavelength region (e.g., 157, 193 and 248 nm) of the electromagnetic spectrum.

BACKGROUND OF THE INVENTION

Due to the continuous demand for smaller microelectronic devices, there exists a need to reduce the size of structural shapes in microelectronics and other related industries. Toward this end, effective lithographic techniques are essential to achieve a reduction in the size of microelectronic structures.

Typical lithographic processes involve pattern-wise exposure of a photosensitive resist to radiation in order to form a patterned resist layer. Thereafter, the resulting image may be developed by contacting the exposed resist layer with a suitable developing substance (e.g. an aqueous alkaline developing solution) to remove certain portions of the resist pattern. The material underlying the resist may then be etched through the openings in the resist to transfer a pattern to an underlying substrate. After the pattern is transferred, the remaining portions of the resist may then be removed.

For better resolution in lithography, an antireflective coating (ARC) may be used to minimize the reflectivity between an imaging layer, such as a photosensitive resist, and an underlying layer. However, in some lithographic imaging processes, the resist does not provide sufficient etch resistance to effectively transfer the desired pattern to a layer underlying the resist. Therefore, a so-called hardmask layer may be applied as an intermediate layer between the patterned resist layer and the underlying material to be patterned. The hardmask layer receives the pattern from the patterned resist layer and should be able to withstand the etching processes needed to transfer the pattern to the underlying material.

Although a number of hardmask materials are known, there is a need for improved hardmask compositions. Since conventional hardmask materials are often difficult to apply to substrates, the use of chemical and physical vapor deposition, special solvents, and/or high-temperature baking may be required. A hardmask composition that may be applied by spin-coating techniques, and which does not require high-temperature baking, would be desirable. A hardmask composition that can be easily etched selective to the overlying photoresist, while being resistant to the etch process needed to pattern the underlying layer, would also be desirable. A hardmask composition that provides superior storage properties and avoids unwanted interactions with an imaging resist layer would further be desirable. A hardmask composition that is particularly resistant to radiation at shorter wavelengths, such as 157, 193, and 247 nm, would also be desirable.

SUMMARY OF THE INVENTION

Therefore, the present invention has been made in view of the above problems of the prior art, and it is one object of the present invention to provide novel hardmask compositions suitable for use in lithographic processes.

It is another object of the present invention to provide methods for forming a patterned material layer on a substrate using the hardmask composition.

In some embodiments of the present invention, antireflective hardmask compositions include:

(a) a polymer mixture including
a first polymer that includes one or more of the following monomeric units

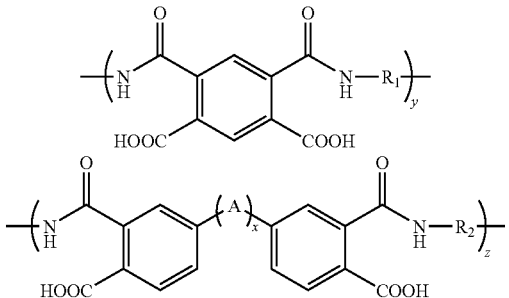

wherein A is a bivalent radical selected from the group consisting of carbonyl, oxy, alkylene, fluoroalkylene, phenyldioxy, and any combination thereof; $R_1$ and $R_2$ are each independently a bivalent radical selected from the group consisting of an alkylene, an arylene, and any combination thereof; and x, y, and z are 0 or integers, wherein $y+z>0$ and $x \geq 0$; and a second polymer including an aryl group;
(b) a crosslinking component; and
(c) an acid catalyst.

In some embodiments of the present invention, the second polymer may include the following monomeric unit:

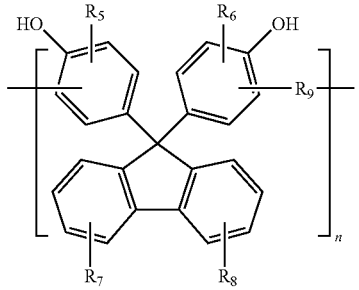

wherein
$R_5$ and $R_6$ may be hydrogen or methyl;
$R_7$ and $R_8$ may each independently be hydrogen, a crosslinking functionality, a chromophore, or any combination thereof; $R_9$ may be an alkylene, a phenyldialkylene, hydroxyphenylalkylene, or any combination thereof; and n is an integer.

In some embodiments of the present invention, methods of forming a patterned material layer on a substrate include (a) forming an antireflective hardmask layer on a material layer, wherein the hardmask layer includes a composition of an embodiment of the invention;

(b) forming a radiation-sensitive imaging layer on the antireflective layer;

(c) exposing the imaging layer to radiation;

(d) developing the imaging layer and the antireflective layer to expose portions of the material layer; and (e) etching the exposed portions of the material layer.

In some embodiments of the invention, a semiconductor integrated circuit fabricated according to a method of the invention is provided.

DETAILED DESCRIPTION OF EMBODIMENTS OF THE INVENTION

The invention is described more fully hereinafter. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein:

The term "carbonyl" refers to a —C(=O)— bivalent radical.

The term "oxy" refers to an —O— bivalent radical.

The terms "alkyl" and "alkylene" refer to a monovalent or bivalent (respectively) straight, branched, or cyclic hydrocarbon radical having from 1 to 12 carbon atoms. In some embodiments, the alkyl(ene) may be a "lower alkyl(ene)" wherein the alkyl(ene) group has 1 to 4 hydrocarbons. For example, lower alkyl may include methyl, ethyl, propyl, isopropyl, butyl, and iso-butyl, while lower alkylene may include methylene (—CH$_2$—), ethylene (—CH$_2$CH$_2$—), propylene (—CH$_2$CH$_2$CH$_2$—), isopropylene (—CH(CH$_3$)$_2$—), butylene (—CH$_2$CH$_2$CH$_2$CH$_2$—), iso-butylene (—C(CH$_3$)$_2$CH$_2$—) and the like.

The term "fluoroalkylene" refers to an alkylene, as defined above, wherein one or more of the hydrogen atoms is substituted with a fluoro group. The term "lower fluoroalkylene" refers to a "lower alkylene" group, as defined above, wherein one or more hydrogen atoms is substituted with a fluoro group. Exemplary lower fluoralkylene groups may include difluoromethylene and bis(trifluoromethyl)methylene, The term "phenyldialkylene" refers to a bivalent radical of the formula —R$_1$-Ph-R$_2$—, wherein R$_1$ and R$_2$ are each independently alkylene groups, as defined herein, and Ph is a bivalent phenylene radical (—C$_6$H$_4$—). The alkylene groups may be attached at any position on the phenylene ring, and the ring may be further substituted, for example, with an alkyl or a hydroxyl (—OH) group. Exemplary phenyldialkylene groups may include benzene-1,4-dimethyl, benzene-1,4-diethyl, and the like.

The term "hydroxyphenylalkylene" refers to a hydroxyphenyl-substituted alkylene, as defined herein. Exemplary hydroxyphenylalkylene groups include hydroxyphenylmethylene (—CH(Ph-OH)—), hydroxyphenylethylene (—CH$_2$CH(Ph-OH)—), and the like. The hydroxyl group may be attached at any position of the phenyl ring.

The terms "aryl" and "arylene" refer to a monovalent or bivalent (respectively) aromatic radical, which may optionally include 1 to 3 additional rings (e.g. cycloalkyl) fused thereto. The aryl(ene) rings may optionally be substituted, for example, with methyl, phenyl, or hydroxyl groups. Exemplary aryl(ene) groups may include:

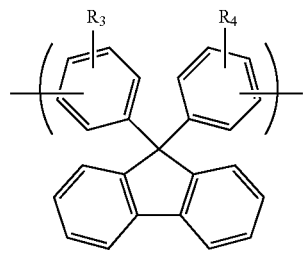

wherein R$_3$ and R$_4$ are each independently hydrogen or methyl, and wherein R$_3$, R$_4$, and the phenylene linkages may be at any position on the phenyl rings.

The term "phenyldioxy" refers to a bivalent radical of the formula —O-Ph-O—, wherein Ph is a bivalent phenylene radical (—C$_6$H$_4$—). The oxy groups may be attached at any position on the phenylene ring, and the ring may be further substituted, for example, with an alkyl or a hydroxyl group.

The term "crosslinking component" refers to a compound, polymer, or the like, that may react with crosslinking functionalities of polymer(s) of the invention, in order to crosslink the polymer(s). The crosslinks may be formed between one type of polymer, or they may be formed between different types of polymer chains. Exemplary crosslinking components may include etherified amino resins, such as methylated melamine resins and butylated melamine resins (e.g. N-methoxymethyl or N-butoxymethyl melamine resins (available at Cytec Industries, Inc.)); etherified amino resins, such as methylated urea resins and butylated urea resins (e.g. Cymel U-65 and UFR 80); methylated/butylated glycoluril compounds (e.g. Powderlink 1174 (Cytec Industries, Inc.)); the compounds described in Canadian Patent No. 1,204,547, which is incorporated herein by reference; 2,6-bis(hydroxymethyl)-p-cresol; the compounds described in Japanese Patent Laid-Open No.1-293339 and bis-epoxy compounds.

The term "acid catalyst" refers to any known acid catalyst, and may be, in some embodiments, a common organic acid, such as p-toluenesulfonic acid monohydrate. In addition, in some embodiments, the acid catalyst may be an acid generator, whereby an acid is produced by under certain conditions. For example, the acid catalyst may be a thermal acid generator (TAG) whereby an acid is generated upon thermal treatment. Exemplary TAGs may include pyridine p-toluenesulfonic acid, 2,4,4,6-tetrabromocyclohexadienol, benzoin tosylate, 2-nitrobenzyl tosylate, and other alkyl esters of organic sulfonic acids. In some embodiments, a photoacid generator (PAG) may be used as the acid catalyst, whereby an acid is produced upon irradiation with a particular radiation source. Exemplary PAGs may include those described in U.S. Pat. Nos. 5,886,102 and 5,939,236, which are both incorporated herein by reference.

The term "crosslinking functionality" refers to a functional group of a polymer of an embodiment of the invention that is capable of reacting with the crosslinking component to crosslink the polymer(s). Exemplary crosslinking functionalities may include hydroxyl and epoxide groups.

The term "chromophore" refers to any suitable chromophore. Exemplary chromophores include phenyl, chrysenyl, pyrenyl, fluoranthrenyl, anthronyl, benzophenonyl, thioxanthonyl, anthracenyl, and anthracenyl derivatives that act as chromophores. Exemplary anthracenyl derivatives may include 9-anthracenyl methanol. In some embodiments, the chromophore contains no nitrogen, and, in other embodiments, the only nitrogen present is in the form of a deactivated amino nitrogen, such as a phenol thiazine.

The phrase "any combination thereof" refers to an embodiment where two or more of the recited components are present. When the term "any combination thereof" is used in reference to a listing of possible components, for example, acid catalysts, it is meant that two ore more of the recited acid catalysts may be used in combination. Further, when the phrase is used in describing a listing of functional groups, it is meant to include embodiments where both of the functional groups are independently present, if applicable, and also to include embodiments where the functional groups are used in combination. For example, a listing of "oxy, fluoroalkylene, phenyldioxy, and any combination thereof" refers to any suitable combination of the substituents, including alkylphenyldioxy (e.g. —$CH_2CH_2$—O-Ph-O—), fluoroalkyleneoxy (e.g. —$CF_2CF_2$—$CH_2O$—), and the like.

In some embodiments of the present invention, antireflective hardmask compositions include (a) a polymer mixture including a first polymer that includes one or more of the following monomeric units

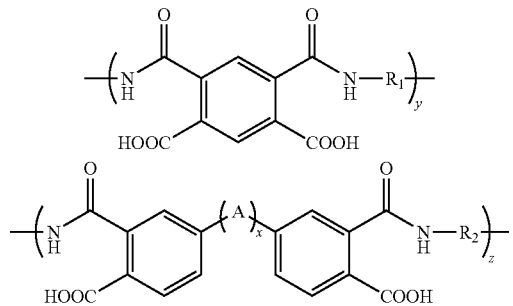

wherein A is a bivalent radical selected from the group consisting of carbonyl, oxy, alkylene, fluoroalkylene, phenyldioxy, and any combination thereof; $R_1$ and $R_2$ are each independently a bivalent radical selected from the group consisting of an alkylene, an arylene, and any combination thereof; and x, y, and z are 0 or integers, wherein y+z>0 and x≧0; and a second polymer including an aryl group;

(b) a crosslinking component; and (c) an acid catalyst.

The monomeric units of the first polymer may be present in any proportion, wherein, in some embodiments, the polymer may be entirely composed of one of the two monomeric units described, while in other embodiments, the polymer may be a mixture of the two monomeric units. Further, the polymer may include other monomeric units in any proportion. The monomeric units may be present in any order, and their order, including in combination with other monomeric units, may be random, uniform, or in any other degree of order.

In some embodiments, x is an integer in a range of about 0-5, and the sum of y and z is greater than or equal to 1 and less than about 1000.

In some embodiments, one or more of the carboxylic acid groups of the first polymer is cyclized with the ortho-amide to form a dicarboxamide. For example, the carboxylic acid groups of the monomeric unit

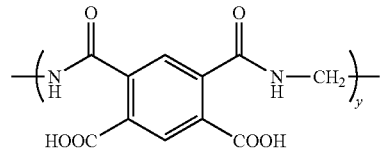

may, under some conditions, cyclize with the ortho-amide to form the mono- or di-carboxamide. For illustration, the dicarboxamide is depicted below:

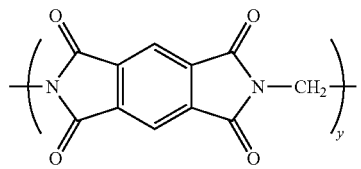

As another example, the carboxylic acid groups of the monomeric unit

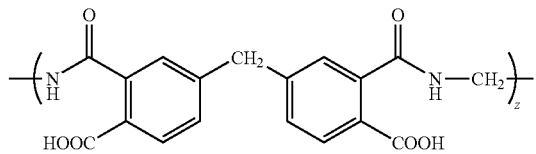

may, under some conditions, cyclize with the ortho-amide to form the mono- or di-carboxamide. For illustration, the dicarboxamide is depicted below:

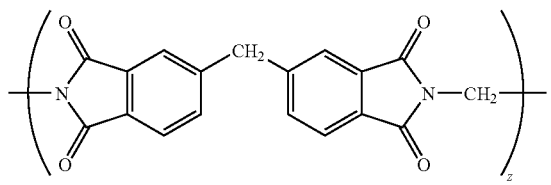

Any proportion of the polymer may contain the cyclized monomer units. In some embodiments, none of the carboxylic acid groups may be cyclized with the ortho-amide, while in other embodiments, some of the carboxylic acid groups may be cyclized with the ortho-amide, and in other embodiments, many or all of the carboxylic acid groups may be cyclized with the ortho-amide.

In some embodiments, A may be carbonyl, oxy, methylene, bis(trifluoromethyl)methylene, or phenyldioxy, and x=0 or 1.

In some embodiments, $R_1$ and/or $R_2$ may be a bivalent radical having the formula:

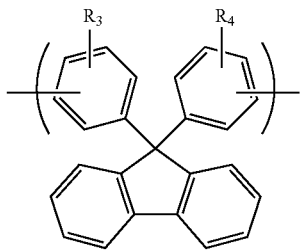

wherein $R_3$ and $R_4$ may be hydrogen or methyl.

In some embodiments, $R_1$ and $R_2$ each may independently be alkylene, arylene, or any combination thereof, and in some embodiments, the alkylene and arylene groups comprise from 1 to 20 carbon atoms.

If the polymer mixture is present in an amount less than about 1% by weight, the hardmask layer may not be formed to a desired thickness, and etching of the underlying layer may not be effectively acheived. However, when the polymer mixture is present in an amount exceeding about 20% by weight, etching of the hardmask layer using an upper photoresist may not be effectively conducted. When the crosslinking component is present in an amount less than about 0.1% by weight, the hardmask layer may be damaged by an upper photoresist solution. However, if the crosslinking component is present in an amount greater than about 5% by weight, the hardmask layer may show undesirable footing in the profile of the photoresist and/or etching of the underlying layer may be not be effectively conducted. When the acid catalyst is present in an amount less than about 0.001% by weight, the hardmask layer may be damaged by an upper photoresist solution. However, if that acid catalyst is present in an amount of more than about 0.03% by weight, undesirable undercut of the profile may occur.

Thus, in some embodiments, the hardmask composition includes about 1 to about 20% by weight of the polymer mixture; about 0.1 to about 5% by weight of the crosslinking component; and about 0.001 to about 0.05% by weight of the acid catalyst. The remaining weight percent of the composition includes a solvent, in some embodiments an organic solvent, and/or a surfactant.

In some embodiments, the hardmask composition includes about 3-10% by weight of the polymer mixture, about 0.1-3% by weight of the crosslinking component, and about 0.001-0.03% by weight of the acid catalyst. The remaining weight percent of the composition includes a solvent, in some embodiments an organic solvent, and/or a surfactant.

Exemplary solvents may include propylene glycol, monomethyl ether acetate, and other solvents commonly used with resists.

In some embodiments, the crosslinking component may be a melamine resin, an amino resin, a glycoluril compound, a bis-epoxy compound, or any combination thereof.

The acid catalyst may catalyze the crosslinking of the crosslinking component with the crosslinking functionality of a polymer of an embodiment of the invention. In some embodiments, the acid catalyst may be p-toluenesulfonic acid monohydrate, pyrididium p-toluenesulfonate, 2,4,4,6-tetrabromocyclohexadienone, an alkyl ester of an organic sulfonic acid, or any combination thereof. In some embodiments, the alkyl ester of an organic sulfonic acid may be benzoin tosylate, 2-nitrobenzyl tosylate, or any combination thereof.

In some embodiments of the present invention, the second polymer includes the following monomeric unit:

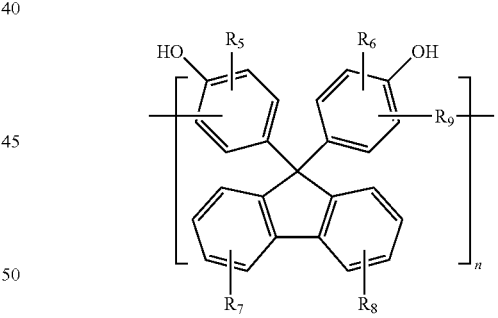

wherein
$R_5$ and $R_6$ may be hydrogen or methyl;
$R_7$ and $R_8$ may each independently be hydrogen, a crosslinking functionality, a chromophore, or any combination thereof; $R_9$ may be an alkylene, a phenyldialkylene, hydroxyphenylalkylene, or any combination thereof; and n is an integer.

In some embodiments, n is in a range of about 1 to about 190.

The first and second polymer, in some embodiments, are mixed at a ratio of about 1:99 to about 99:1. The mixing ratio may be varied according to the characteristics of the polymer composition.

In some embodiments, $R_9$ may be methylene, benzene-1,4-dimethyl, and hydroxyphenylmethylene.

In some embodiments, the chromophore moiety is a functional group that may include phenyl, chrysenyl, pyrenyl, fluoranthrenyl, anthronyl, benzophenonyl, thioxanthonyl, anthracenyl, anthracenyl derivatives, or any combination thereof.

In some embodiments, the second polymer has a weight average molecular weight in a range of about 500 to about 30,000 grams per mol.

In some embodiments of the present invention, methods of forming a patterned material layer on a substrate include (a) forming an antireflective hardmask layer on a material layer, wherein the hardmask layer includes a composition of an embodiment of the invention;

(b) forming a radiation-sensitive imaging layer on the antireflective layer;

(c) exposing the imaging layer to radiation;

(d) developing the imaging layer and the antireflective layer to expose portions of the material layer; and (e) etching the exposed portions of the material layer.

In some embodiments of the invention, the method can be carried out in accordance with the following procedure. First, a material to be patterned (e.g., an aluminum or silicon nitride) may be formed onto a silicon substrate by any technique known in the art. A hardmask composition according to an embodiment of the present invention may then be spin-coated onto the material. In some embodiments, the composition is spin-coated to a thickness in a range of about 500 to about 4000 Å. The hardmask composition may then be baked, for example, at a temperature in the range of about 100 to about 300° C., for a time in a range of about 10 seconds to about 10 minutes, to form a hardmask layer. A radiation-sensitive imaging layer may then be formed on the hardmask layer. The imaging layer may then be developed by exposing portions of the resist to radiation in order to form a pattern on the imaging layer. The imaging layer and the antireflective hardmask layer may then be selectively removed to expose portions of the material layer. Etching may then be performed. In some embodiments, dry etching is performed using a gas, for example, a $CHF_3/CF_4$ mixture. After the formation of a patterned material layer, the remaining portions of the resist may be removed using a common photoresist stripper.

Accordingly, hardmask compositions of the present invention and the resulting lithographic structures may be used in the fabrication and design of integrated circuit devices in semiconductor manufacture. The compositions and methods of embodiments of the present invention may be used, for example, in the formation of patterned material structures, such as metal wirings, holes for contacts and biases, insulating sections (e.g. damascene trenches and shallow trench isolation), and trenches for capacitor structures. Thus, in some embodiments of the invention, a semiconductor integrated circuit fabricated according to a method of the invention is provided.

The present invention will now be described in more detail with reference to the following examples. However, these examples are given for the purpose of illustration and are not to be construed as limiting the scope of the invention.

EXAMPLE 1

Synthesis of Compound 1

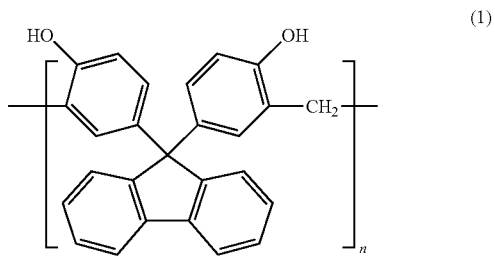

A solution of 28.03 g (0.08 moles) of 4,4'-(9-fluorenylidene)diphenol and 0.3 g of p-toluenesulfonic acid in 200 g of γ-butyrolactone was charged into a one-liter four-neck flask equipped with a mechanical agitator, a condenser, a 300 ml dropping funnel and a nitrogen feed tube. The flask was heated in an stirred oil bath while it was purged with nitrogen. When the internal temperature of the reaction solution reached 100° C., 5.27 g (0.065 moles) of a 37wt % aqueous formaldehyde solution was slowly added dropwise to the flask for 30 minutes using the dropping funnel. The reaction mixture was allowed to react for 12 hours. After completion of the reaction, the reaction flask was sufficiently cooled to room temperature. The concentration of the reaction solution was adjusted to 20 wt % by using methyl amine ketone (MAK). The solution was washed with water three times using a 3 L separatory funnel, and concentrated using an evaporator. Thereafter, the concentrate was diluted with MAK and methanol to obtain a 15 wt % solution in MAK/methanol (4/1 (w/w)). The solution thus obtained was transferred to a 3 L separatory funnel, and then n-heptane was added thereto to remove low molecular weight compounds containing the monomer, yielding the desired phenol resin (Mw=4000, n=10~11).

Synthesis of Compound 2

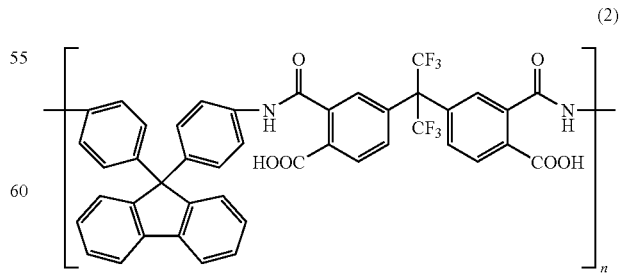

35.539 g of hexafluoroisopropylidene bisphthalic dianhydride (6-FDA) was added to a solution 27.596 g of 9,9-bis(4-aminophenyl)fluorene (BAFL) in 78 g of N-methyl-2-pyrrolidone (NMP), and dissolved with stirring for 10 minutes. The solution was diluted with 487.6 g of NMP. The dilution was stirred at room temperature for 12 hours, affording the desired product ($M_n$=140 K, $M_w$=200 K).

Preparation of Sample Solution 0.70 g of Compound 1, 0.10 g of Compound 2, 0.2 g of a crosslinking agent (Powderlink 1174), and 2 mg of pyridinium p-toluenesulfonate were dissolved in 9 g of PGMEA, and filtered to prepare a sample solution.

EXAMPLE 2

Synthesis of Compound 3

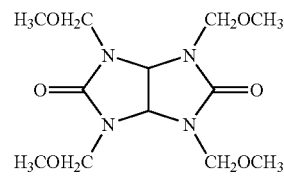

Structure of Powderlink 1174

Comparison of refractive index (n) and extinction coefficient (k) after application to silicon wafer Each of the sample solutions prepared in Examples 1 and 2 and Comparative Example 1 was spin-coated on a silicon wafer and baked at 200° C. for 60 seconds to form a 1,500 Å

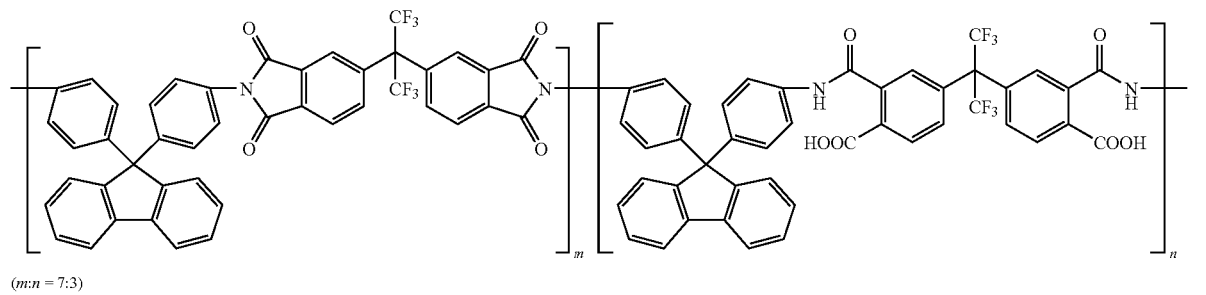

(3)

($m$:$n$ = 7:3)

After 22.21 g of 6-FDA was added to a solution of 17.42 g of BAFL in 354.9 g of NMP, the resulting mixture was allowed to react with stirring for 12 hours. To the reaction mixture were added 11.8 g of pyridine and 15.24 g of acetic anhydride, followed by heating to 90° C. for one hour. NMP was further added to the reaction mixture. Pyridine, acetic anhydride, and NMP were removed by distillation to afford the desired product as a solution ($M_n$=135 K, $M_w$=180 K).

Preparation of Sample Solution 0.70 g of Compound 1, 0.10 g of Compound 3, 0.2 g of a crosslinking agent (Powderlink 1174), and 2 mg of pyridinium p-toluenesulfonate were dissolved in 9 g of PGMEA, and filtered to prepare a sample solution.

COMPARATIVE EXAMPLE 1

0.80 g of the polymer of Compound 1, 0.20 g of an oligomeric crosslinking agent (Powderlink 1174) consisting of the repeating unit shown below, and 2 mg of pyridinium p-toluenesulfonate were dissolved in 9 g of propyleneglycolmonoethylacetate (PGMEA), and filtered to prepare a sample solution.

thick film. The refractive index (n) and extinction coefficient (k) of the film were measured using an ellipsometer (J. A. Woollam). The results are shown in Table 1.

TABLE 1

| Samples used in formation of films | Optical properties (193 nm) | | Optical properties (248 nm) | |
|---|---|---|---|---|
| | Refractive index (n) | Extinction coefficient (k) | Refractive index (n) | Extinction coefficient (k) |
| Example 1 | 1.45 | 0.81 | 1.99 | 0.28 |
| Example 2 | 1.43 | 0.95 | 2.00 | 0.27 |
| Comparative Example 1 | 1.42 | 0.80 | 2.01 | 0.25 |

Comparison of 90-nm Line and space pattern after application to aluminum-coated silicon wafer Each of the sample solutions prepared in Examples 1 and 2 and Comparative Example 1 was spin-coated on an aluminum-coated silicon wafer and baked at 200° C. for 60 seconds to form a 1,500 Å thick film. A photoresist for KrF was coated on the film, baked at 110° C. for 60 seconds, light-exposed using an exposure system manufactured by ASML (XT:

1400, NA 0.93), and developed with tetramethylammonium hydroxide (TMAH) (2.38 wt % aqueous solution). A 90-nm line and space pattern was observed using an FE-SEM, and the obtained results are shown in Table 2 below. Exposure latitude (EL) margin according to the changes in exposure energy and depth of focus (DoF) margin according to the changes in the distance from a light source were measured, and recorded.

TABLE 2

| Samples used in formation of films | Pattern characteristics | |
|---|---|---|
| | EL margin (Δ mJ/exposure energy mJ) | DoF Margin (μm) |
| Example 1 | 0.07 | 0.1 |
| Example 2 | 0.10 | 0.2 |
| Comparative Example 1 | 0.07 | 0.1 |

The patterned specimens were dry-etched using a mixed gas of $CHF_3/CF_4$, and further dry-etched using a mixed gas of $BCl_3/Cl_2$. Finally, all remaining organic materials were removed using $O_2$, and a cross section of the specimens was observed using an FE SEM. The results are shown in Table 3.

TABLE 3

| Samples used in formation of films | Pattern shape after etching |
|---|---|
| Examples 1 | Vertical |
| Examples 2 | Vertical |
| Comparative Examples 1 | Tapered |

The specimens were dry-etched using a mixed gas of $CHF_3/CF_4$, and the thickness difference before and after the dry etching was measured. The results are shown in Table 4.

TABLE 4

| Samples used in formation of films | Etching rate of $BCl_3/Cl_2$ gas (nm/min) |
|---|---|
| Example 1 | 94 |
| Example 2 | 89 |
| Comparative Example 1 | 95 |

Comparison of 80-nm line and space pattern after application to SiN-coated silicon wafer Each of the sample solutions prepared in Examples 1 and 2 and Comparative Example 1 was spin-coated onto a silicon nitride (SiN)-coated silicon wafer and baked at 200° C. for 60 seconds to form a 1,500 Å thick film. A photoresist for ArF was coated on the film, baked at 110° C. for 60 seconds, light-exposed using an ArF exposure system (ASML1250 (FN70 5.0 active, NA 0.82), and developed with TMAH (2.38 wt % aqueous solution). An 80-nm line and space pattern was observed using an FE-SEM, and the obtained results are shown in Table 5 below. Exposure latitude (EL) margin according to the changes in exposure energy and depth of focus (DoF) margin according to the changes in the distance from a light source were measured and recorded.

TABLE 5

| Samples used in formation of films | Pattern characteristics | |
|---|---|---|
| | EL margin (Δ mJ/exposure energy mJ) | DoF Margin (μm) |
| Example 1 | 0.05 | 0.1 |
| Example 2 | 0.1 | 0.2 |
| Comparative Example 1 | 0.05 | 0 |

The patterned specimens were dry-etched using a mixed gas of $CHF_3/CF_4$, and further dry-etched using a mixed gas of $CHF_3/CF_4$ with different mixing ratios. Finally, all remaining organic materials were removed using $O_2$, and the cross section of the specimens was observed using an FE SEM. The results are shown in Table 6.

TABLE 6

| Samples used in formation of films | Pattern shape after etching |
|---|---|
| Examples 1 | No pattern was formed |
| Examples 2 | Vertical |
| Comparative Examples 1 | Tapered |

As apparent from the above description, compositions of the present invention may provide hardmask layers having excellent optical properties, superior mechanical properties, and high etch selectivity. In addition, in some embodiments, the compositions may be easily applied by spin-coating techniques. Furthermore, in some embodiments, the compositions may possess superior storage life and contain few or no acid pollutants.

Although the particular embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An antireflective hardmask composition, comprising:
   (a) a polymer mixture comprising
      a first polymer comprising one or more of the following monomeric units

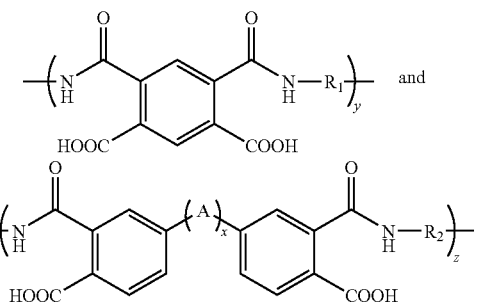

wherein A is a bivalent radical selected from the group consisting of carbonyl, oxy, alkylene, fluoroalkylene, phenyldioxy, and any combination thereof;
   $R_1$ and $R_2$ are each independently a bivalent radical selected from the group consisting of an alkylene, an arylene, and any combination thereof, and wherein $R_1$ and/or $R_2$ is

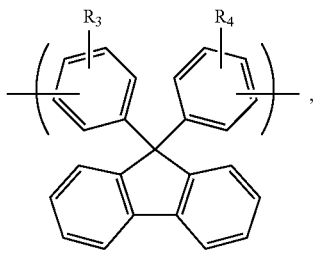

wherein $R_3$ and $R_4$ are each independently hydrogen or methyl; and x, y, and z are 0 or integers, wherein y+z>0 and x≧0; and a second polymer comprising the monomeric unit

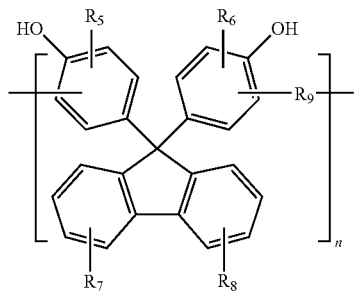

wherein $R_5$ and $R_6$ are each independently hydrogen or methyl;

$R_7$ and $R_8$ are each independently selected from the group consisting of hydrogen, a crosslinking functionality, a chromophore, and any combination thereof;

$R_9$ is selected from the group consisting of an alkylene, a phenyldialkylene, hydroxyphenylalkylene, and any combination thereof; and n is an integer;

(b) a crosslinking component; and (c) an acid catalyst.

2. The composition of claim 1, wherein x is from 0-5 and 1≦y+z<1000.

3. The composition of claim 1, wherein one or more of the carboxylic acid groups of the first polymer is cyclized with the ortho-amide to form a dicarboxamide.

4. The composition of claim 1, wherein A is a bivalent radical selected from the group consisting of carbonyl, oxy, methylene, bis(trifluoromethyl)methylene, and phenyldioxy, and x=0 or 1.

5. The composition of claim 1, comprising about 1 to about 20% by weight of the polymer mixture;
about 0.1 to about 5% by weight of the crosslinking component; and
about 0.001 to about 0.05% by weight of the acid catalyst.

6. The composition of claim 1, further comprising a solvent.

7. The composition of claim 1, further comprising a surfactant.

8. The composition of claim 1, wherein the crosslinking component is selected from the group consisting of a melamine resin, an amino resin, a glycoluril compound, a bisepoxy compound, and any combination thereof.

9. The composition of claim 1, wherein the acid catalyst is selected from the group consisting of p-toluenesulfonic acid monohydrate, pyrididium p-toluenesulfonate, 2,4,4,6-tetrabromocyclohexadienone, an alkyl ester of an organic sulfonic acid, and any combination thereof.

10. The composition of claim 9, wherein the alkyl ester of an organic sulfonic acid is selected from the group consisting of benzoin tosylate, 2-nitrobenzyl tosylate, and any combination thereof.

11. The composition of claim 1, wherein x is from 0-5, 1≦y+z<1000, and n is from 1 to 190.

12. The composition of claim 1, wherein $R_9$ is a bivalent radical selected from the group consisting of methylene, benzene-1,4-dimethyl, and hydroxyphenylmethylene.

13. The composition of claim 1, wherein the chromophore moiety is a functional group selected from the group consisting of phenyl, chrysenyl, pyrenyl, fluoranthrenyl, anthronyl, benzophenonyl, thioxanthonyl, anthracenyl, anthracenyl derivative, and any combination thereof.

14. The composition of claim 1, wherein the second polymer has a weight average molecular weight of from about 500 to about 30,000 grams per mol.

15. A method of forming a patterned material layer on a substrate, comprising
(a) forming an antireflective hardmask layer on a material layer, wherein said hardmask layer comprises the composition according to claim 1;
(b) forming a radiation-sensitive imaging layer on the antireflective layer;
(c) exposing the imaging layer to radiation;
(d) developing the imaging layer and the antireflective layer to expose portions of the material layer; and
(e) etching the exposed portions of the material layer.

* * * * *